United States Patent
Zhao et al.

(10) Patent No.: US 11,037,937 B2
(45) Date of Patent: Jun. 15, 2021

(54) SRAM BIT CELLS FORMED WITH DUMMY STRUCTURES

(71) Applicant: GLOBALFOUNDRIES U.S. Inc., Santa Clara, CA (US)

(72) Inventors: Meixiong Zhao, Ballston Lake, NY (US); Randy W. Mann, Milton, NY (US); Sanjay Parihar, Austin, TX (US); Anton Tokranov, Cohoes, NY (US); Hong Yu, Rexford, NY (US); Hongliang Shen, Ballston Lake, NY (US); Guoxiang Ning, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/689,330

(22) Filed: Nov. 20, 2019

(65) Prior Publication Data

US 2021/0151443 A1    May 20, 2021

(51) Int. Cl.
*H01L 27/11* (2006.01)
*H01L 21/8238* (2006.01)
*H01L 21/8239* (2006.01)

(52) U.S. Cl.
CPC ...... *H01L 27/1104* (2013.01); *H01L 21/8239* (2013.01); *H01L 21/823821* (2013.01)

(58) Field of Classification Search
CPC ............ H01L 27/1104; H01L 21/8239; H01L 21/823821
USPC ........................................................ 365/156
See application file for complete search history.

(56) References Cited

U.S. PATENT DOCUMENTS

| | | | |
|---|---|---|---|
| 7,763,531 B2 | 7/2010 | Abadeer et al. | |
| 8,822,320 B2 | 9/2014 | Cheng et al. | |
| 10,163,914 B2 | 12/2018 | Zhang et al. | |
| 2010/0301419 A1* | 12/2010 | Anderson | H01L 27/11 257/368 |
| 2013/0107610 A1* | 5/2013 | Mann | H01L 27/1104 365/156 |
| 2019/0109193 A1* | 4/2019 | Liaw | H01L 23/5226 |
| 2020/0066735 A1* | 2/2020 | Liaw | H01L 21/324 |
| 2020/0135580 A1* | 4/2020 | Hsieh | H01L 21/823481 |
| 2020/0135740 A1* | 4/2020 | Liaw | H01L 29/1033 |

* cited by examiner

*Primary Examiner* — Fernando Hidalgo
(74) *Attorney, Agent, or Firm* — Thompson Hine LLP; Francois Pagette

(57) ABSTRACT

Structures including static random access memory bit cells and methods of forming a structure including static random access memory bit cells. A first bit cell includes a first plurality of semiconductor fins, and a second bit cell includes a second plurality of semiconductor fins. A deep trench isolation region is laterally positioned between the first plurality of semiconductor fins of the first bit cell and the second plurality of semiconductor fins of the second bit cell.

17 Claims, 7 Drawing Sheets

SRAM BIT CELLS FORMED WITH DUMMY STRUCTURES

BACKGROUND

The present invention relates to semiconductor device fabrication and integrated circuits and, more specifically, to structures including static random access memory bit cells and methods of forming a structure including static random access memory bit cells.

Static random access memory (SRAM) may be used, for example, to temporarily store data in a computer system. An SRAM device includes an array of bit cells in which each bit cell retains a single bit of data during operation. Each SRAM bit cell may have a six-transistor (6T) design that includes a pair of cross-coupled inverters providing a storage element and a pair of pass-gate transistors connecting the inverters to complementary bit lines. The pass-gate transistors are controlled by word lines, which are used to select the SRAM memory cell for read or write operations. When continuously powered, the memory state of an SRAM device persists without the need for data refresh operations.

A two-port SRAM bit cell is augmented by the addition of a read port that includes two additional transistors. The additional transistors permit independent read operations to occur without disturbing the internal node that includes the cross-coupled inverters.

The transistors of an SRAM bit cell may be fin-type field-effect transistors in which multiple semiconductor fins are concurrently patterned using a multiple patterning technique, such as self-aligned double patterning. The semiconductor fins are patterned with a variable pitch layout that places the semiconductor fins at appropriate locations within the bit cell. Asymmetries present in the variable pitch layout can result in variations in the critical dimensions of the semiconductor fins within a single SRAM bit cell due to etch loading during double patterning.

Improved structures including static random access memory bit cells and methods of forming a structure including static random access memory bit cells are needed.

SUMMARY

In embodiments of the invention, a structure for a static random access memory is provided. The structure includes a first bit cell having a first plurality of semiconductor fins, a second bit cell having a second plurality of semiconductor fins, and a deep trench isolation region laterally positioned between the first plurality of semiconductor fins of the first bit cell and the second plurality of semiconductor fins of the second bit cell.

In embodiments of the invention, a method of forming a structure for a static random access memory is provided. The method includes forming a first plurality of semiconductor fins of a first bit cell, forming a second plurality of semiconductor fins of a second bit cell, and forming a first deep trench isolation region that is laterally positioned between the first plurality of semiconductor fins of the first bit cell and the second plurality of semiconductor fins of the second bit cell.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
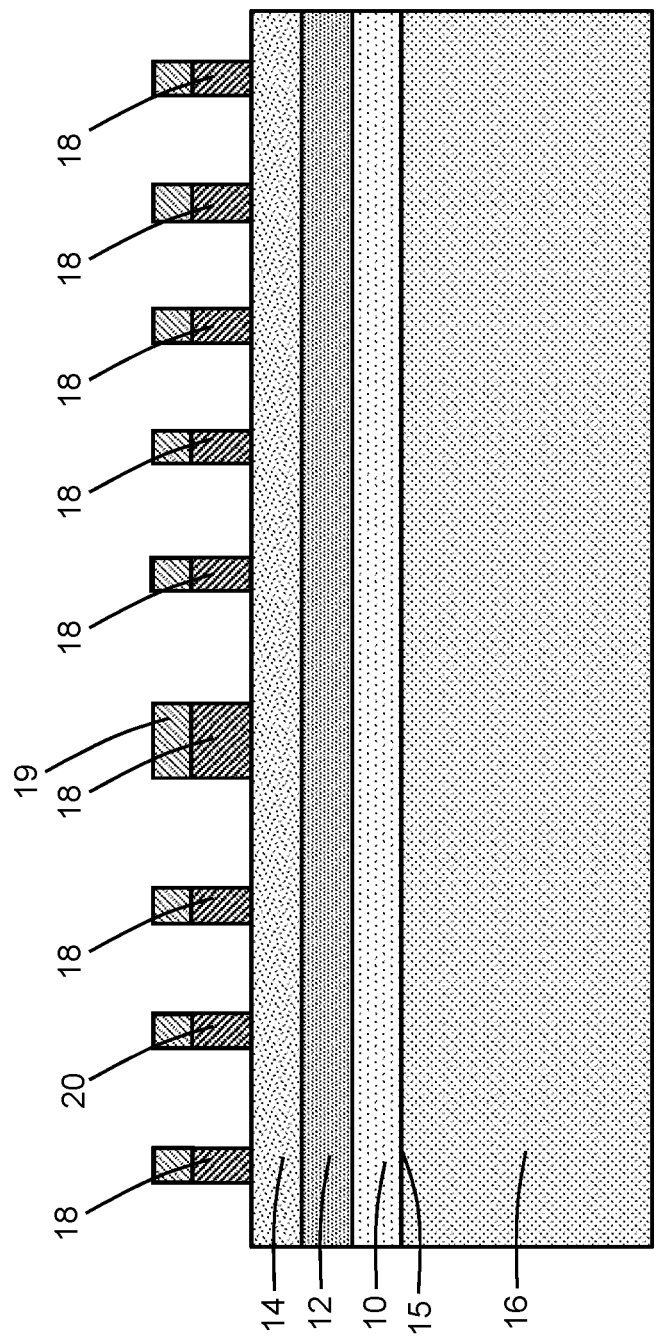
FIGS. 1-6 are cross-sectional views of a structure at successive fabrication stages of a processing method in accordance with embodiments of the invention.

With reference to FIG. 1 and in accordance with embodiments of the invention, a layer stack include a hardmask 10, a hardmask 12, and a sacrificial layer 14 are positioned over a top surface 15 of a semiconductor substrate 16. Mandrels 18, 20 are arranged on a top surface of the sacrificial layer 14. Each of the mandrels 18, 20 is topped by a cap 19, which may be a remnant of an etch mask used to pattern the mandrels 18, 20 with lithography and etching processes. The hardmasks 10, 12 are used to facilitate a pattern transfer from the mandrels 18, 20 to the sacrificial layer 14.

The hardmasks 10, 12 are composed of different materials characterized by dissimilar etch selectivities. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process. The hardmask 10 may be composed of, for example, silicon nitride deposited by, for example, atomic layer deposition or chemical vapor deposition. The hardmask 12 may be composed of a dielectric material, such as silicon dioxide, deposited by, for example, atomic layer deposition or chemical vapor deposition.

The sacrificial layer 14 may be composed of, for example, amorphous silicon. The semiconductor substrate 16 may be composed of a single-crystal semiconductor material, such as single-crystal silicon. The mandrels 18, 20 may be composed of a spin-on hardmask (SOH), and the caps 19 may be composed of silicon oxygen-nitride (SiON).

The mandrels 18, 20 are formed with a given arrangement on the top surface of the sacrificial layer 14. The introduction of the mandrel 20 in the break region 22 subsequently operates to reduce the asymmetry in critical dimensions of the fins at different locations in a bit cell. In conventional multiple patterning processes for forming bit cells of a static random access memory (SRAM), the mandrel 20 is absent from the mandrel pattern and only the mandrels 18 are present.

Figure 2:
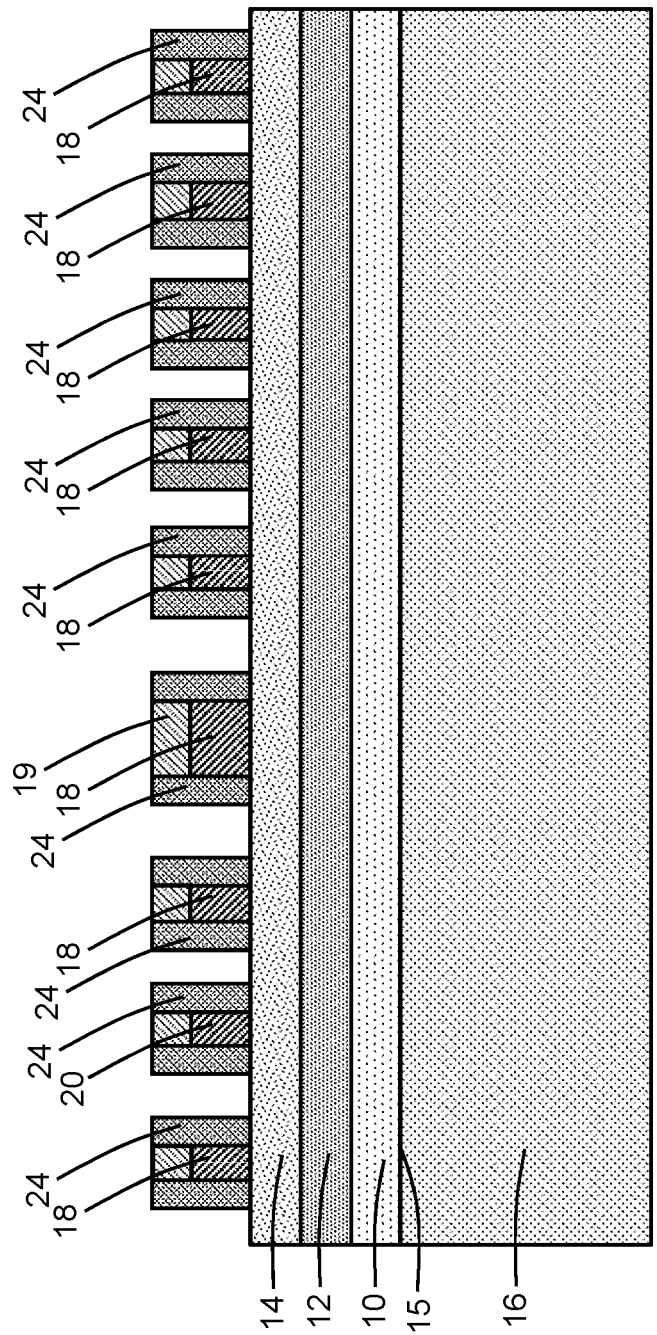

With reference to FIG. 2 in which like reference numerals refer to like features in FIG. 1 and at a subsequent fabrication stage of the processing method, spacers 24 are formed on the sidewalls of the mandrels 18, 20. The spacers 24 may be formed by depositing a spacer layer and etching the spacer layer using an anisotropic etching process, such as a reactive ion etching process. The etching process removes the material of the spacer layer from top surfaces of the mandrels 18, 20 and from the top surface of the sacrificial layer 14. The spacer layer may be composed of a dielectric material that is deposited using, for example, atomic layer deposition over the mandrels 18, 20 and exposed areas of the sacrificial layer 14 not covered by the mandrels 18, 20. The spacer layer may be a conformal coating having a uniform or substantially uniform thickness. The material constituting the spacer layer and spacers 24 may be chosen such that the mandrels 18 can be selectively removed by a given etch chemistry in a subsequent fabrication stage. For example, if the mandrels 18, 20 are composed of amorphous silicon, the dielectric material constituting the spacer layer and spacers 24 may be composed of a dielectric material such as titanium oxide or silicon dioxide.

The spacers 24 associated with the mandrels 18 have a placement directly related to the subsequent placement of semiconductor fins that are used to fabricate the pass-gate transistors, pull-down transistors, pull-up transistors, and read-port transistors of SRAM bit cells. The placement of the spacers 24 associated with the mandrel 20 have a placement directly related to the subsequent placement of dummy semiconductor fins that are removed and replaced by a deep trench isolation region.

Figure 3:
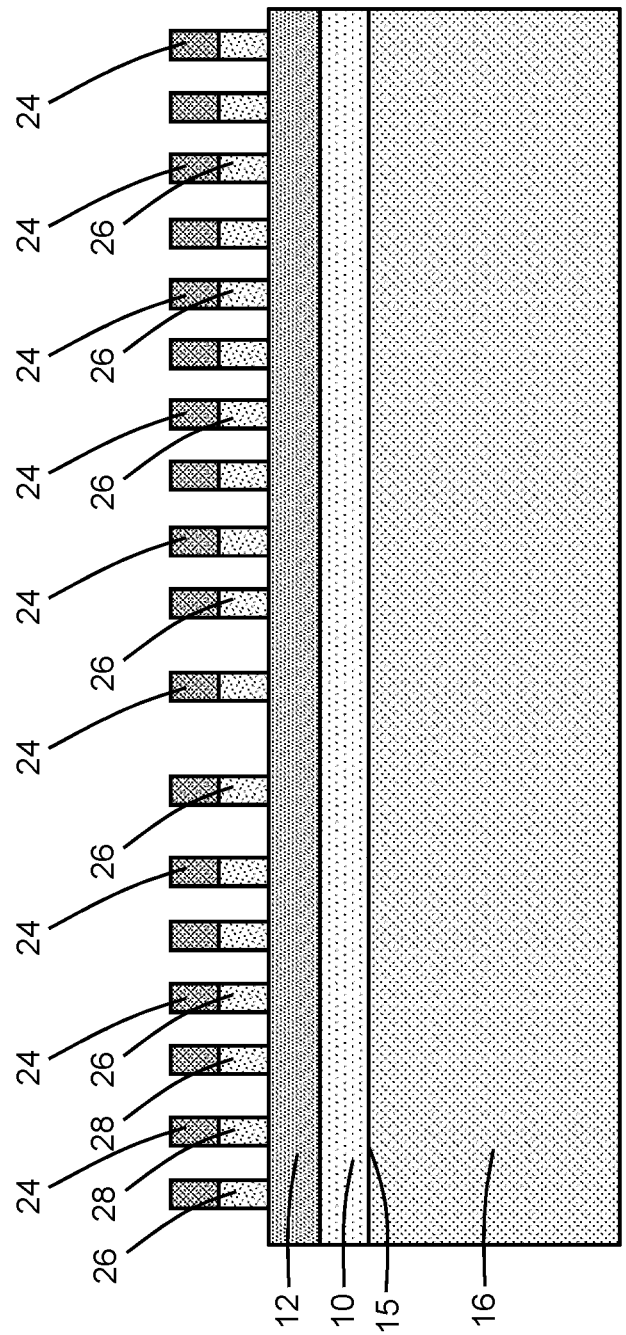

With reference to FIG. 3 in which like reference numerals refer to like features in FIG. 2 and at a subsequent fabrication stage, the mandrels 18, 20 and their caps 19 may be pulled and removed using an etching process selective to the spacers 24. The removal of the mandrels 18, 20 exposes additional areas on the top surface of the sacrificial layer 14. The sacrificial layer 14 is then patterned with an etching process using the spacers 24 as an etch mask to define mandrels 26, 28.

Figure 4:
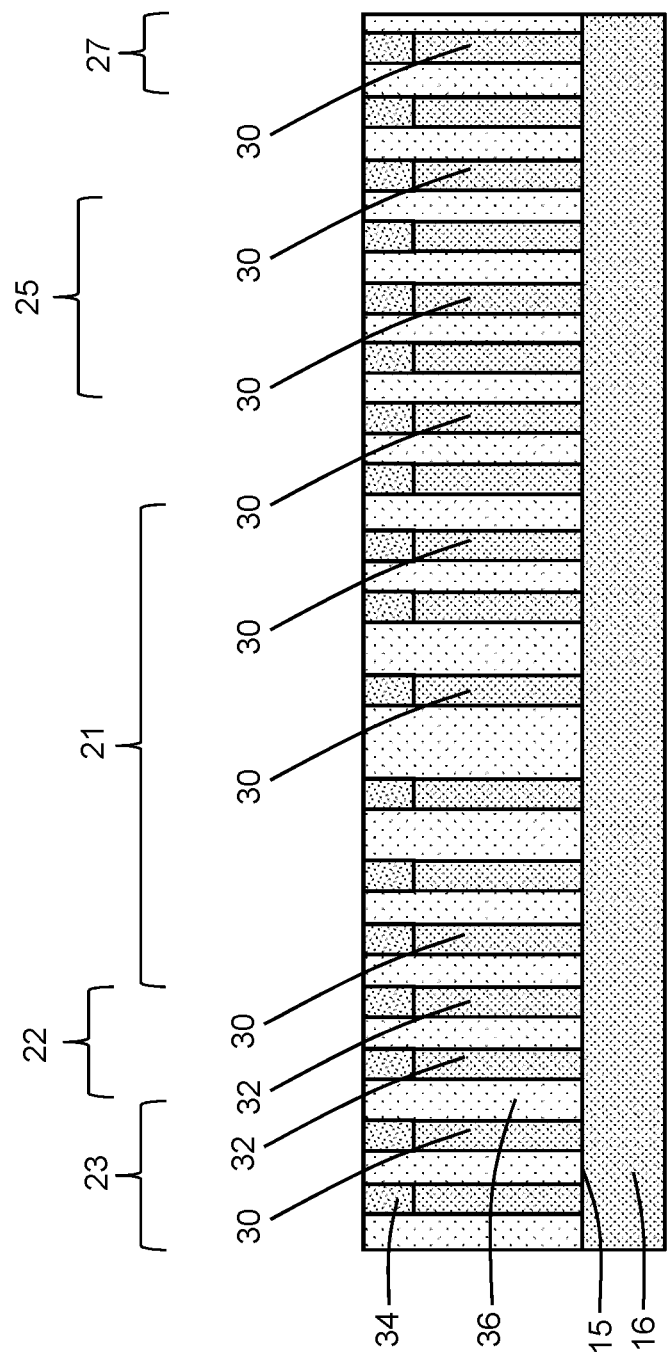

With reference to FIG. 4 in which like reference numerals refer to like features in FIG. 3 and at a subsequent fabrication stage, the fin pattern established by the spacers 24 and the underlying mandrels 26, 28 is transferred using the hardmask 12 to the hardmask 10. With the patterned hardmask 10 functioning as an etch mask, the semiconductor substrate 16 is etched to define semiconductor fins 30, 32 that project upwardly away from a relocated top surface 15 of the semiconductor substrate 16. Fin caps 34 on the semiconductor fins 30, 32 represent residual material of the hardmask 10 from the patterning.

The semiconductor fins 30 belong to the pass-gate, pull-up, and pull-down transistors of respective six-transistor portions 21, 23 of adjacent SRAM bit cells and to the transistors of the read ports 25, 27 of adjacent SRAM bit cells. Additional fins (not shown) similar to semiconductor fins 30 are included in the six-transistor portion 23 of the SRAM bit cell located adjacent to the six-transistor portion 21, and additional fins (not shown) also similar to semiconductor fins 30 are also included in the read port 27 of the SRAM bit cell located adjacent to the read port 25. The six-transistor portion 21 and read port 25 may be components of an active region of a single bit cell in the SRAM memory, the six-transistor portion 23 may be a component of a different active region of a single bit cell in the SRAM memory, and the read port 27 may be a component of a different active region of a single bit cell in the SRAM memory. The six-transistor portion 23 is associated with a read port (not shown), and the different bit cells belong to a large array of two-port six-transistor bit cells forming a SRAM memory The semiconductor fins 30 of the six-transistor portion 21 are separated by an average spacing, and the semiconductor fins 30 of the six-transistor portion 23 are also separated by an average spacing that may be identical to the average spacing separating the semiconductor fins 30 of the region defined by the six-transistor portion 21. The average spacings may be an average pitch determined by an average sum of line width and line spacing of the semiconductor fins 30.

The semiconductor fins 32 are located in a break region 22 between the semiconductor fins 30 of the six-transistor portions 21, 23 of different bit cells. In contrast to the semiconductor fins 30, the semiconductor fins 32 are sacrificial or dummy structures that are subsequently removed and that do not appear in completed construction of the SRAM bit cells. The semiconductor fins 32 reduce the variable pitch of the layout of the semiconductor fins 30 by being formed in the break region 22 and, thereby, reduce etch loading that would otherwise cause variations in the critical dimensions between the semiconductor fins 30 in the six-transistor portion 21 adjacent to the adjacent six-transistor portion 23 and the semiconductor fins 30 in the six-transistor portion 21 adjacent to the semiconductor fins 30 of the read port 25.

A dielectric layer 36 composed of, for example, silicon dioxide is deposited that fills the spaces between the semiconductor fins 30, 32 and is planarized relative to the fin caps 34. The dielectric layer 36 may function as shallow trench isolation that surrounds the semiconductor fins 30. The dielectric layer 36 is subsequently recessed such that an upper portion of each of the semiconductor fins 30 is revealed above the recessed dielectric layer 36.

Figure 5:
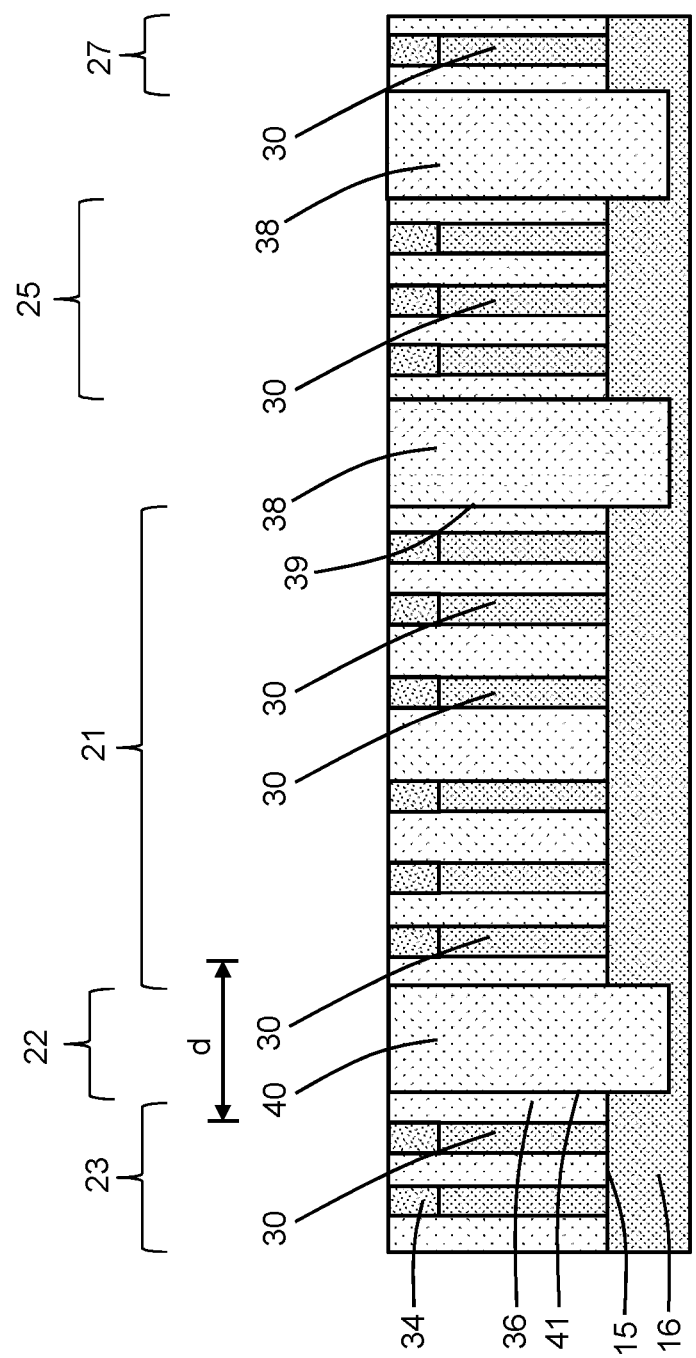

With reference to FIG. 5 in which like reference numerals refer to like features in FIG. 4 and at a subsequent fabrication stage, deep trench isolation regions 38, 40 are formed by patterning some of the semiconductor fins 30, the semiconductor fins 32, portions of the dielectric layer 36, and the semiconductor substrate 16 with lithography and etching processes to define deep trenches 39, 41. The deep trenches 39, 41 are filled by depositing a layer composed of a dielectric material, such as an oxide of silicon (e.g., silicon dioxide), in the deep trenches 39, 41 and planarization to define the deep trench isolation regions 38, 40. Portions of each of the deep trench isolation regions 38, 40 are located in the semiconductor substrate 16 because the deep trenches 39, 41 penetrate to a depth beneath the relocated top surface 15 of the semiconductor substrate 16. As a result, a portion of each of the deep trench isolation regions 38, 40 is located in the semiconductor substrate 16 below the interface between the dielectric layer 36 and the top surface 15 of the semiconductor substrate 16.

One of the deep trench isolation regions 38 is positioned at a location between the semiconductor fins 30 used to fabricate the pass-gate, pull-up, and pull-down transistors of in the six-transistor portion 21 of the SRAM bit cell and the semiconductor fins 30 used to fabricate the transistors of the read port 25 of the SRAM bit cell. Another of the deep trench isolation regions 38 is positioned at a location between the semiconductor fins 30 used to fabricate the read port 25 associated with the six-transistor portion 21 of the SRAM bit cell and the semiconductor fins 30 used to fabricate the transistors of the read port 27 associated with the six-transistor portion of the adjacent SRAM bit cell.

The deep trench isolation region 40 is laterally positioned at a location between the semiconductor fins 30 used to fabricate the pass-gate, pull-up, and pull-down transistors of the six-transistor portions 21, 23 of adjacent SRAM bit cells. The semiconductor fins 32, which are absent in conventional fin layouts, represent dummy fins that are specifically removed by the etching process forming the deep trench 41 in which the deep trench isolation region 40 is located. One of the semiconductor fins 30 in the six-transistor portion 21 and one of the semiconductor fins 30 in the six-transistor portion 23 are nearest neighbors to each other and to the semiconductor fins 32, and the deep trench isolation region 40 is laterally positioned between these nearest-neighbor semiconductor fins 30. The distance, d, across the break region 22 between the nearest-neighbor semiconductor fins 30 in the six-transistor portions 21, 23 is greater than the average spacings of the respective semiconductor fins 30 in either of the six-transistor portions 21, 23.

Figure 6:
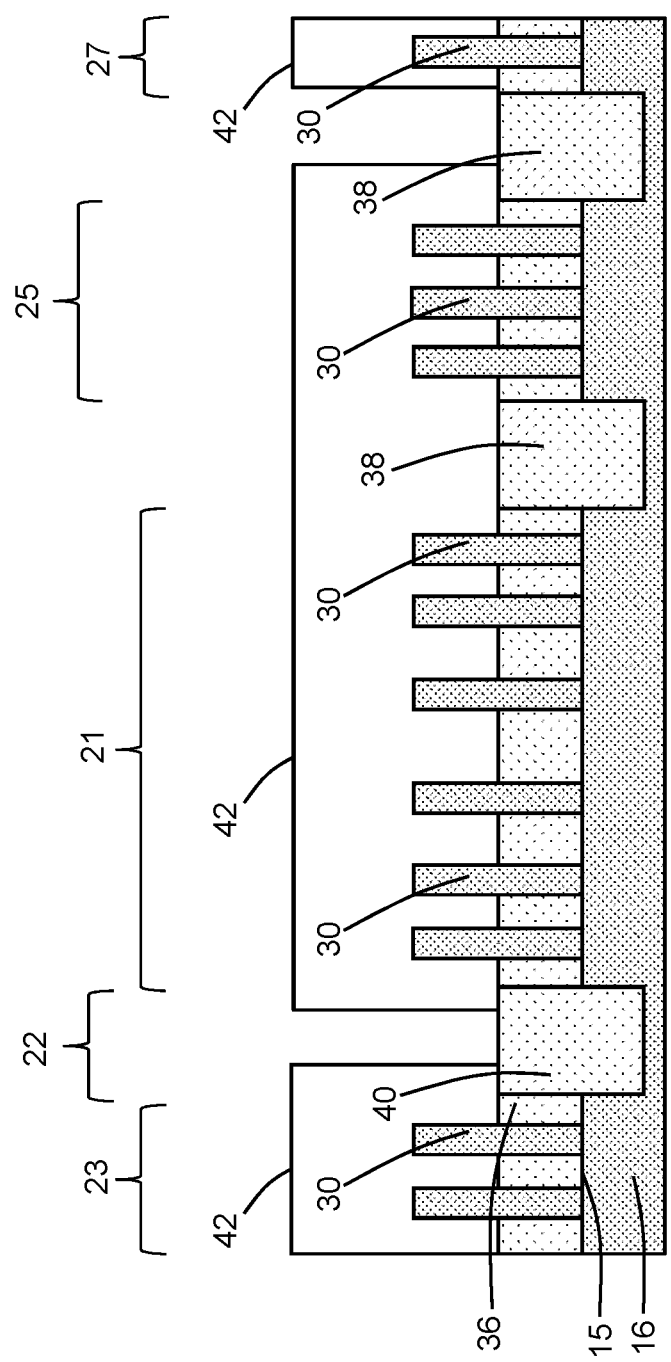
Figure 7:
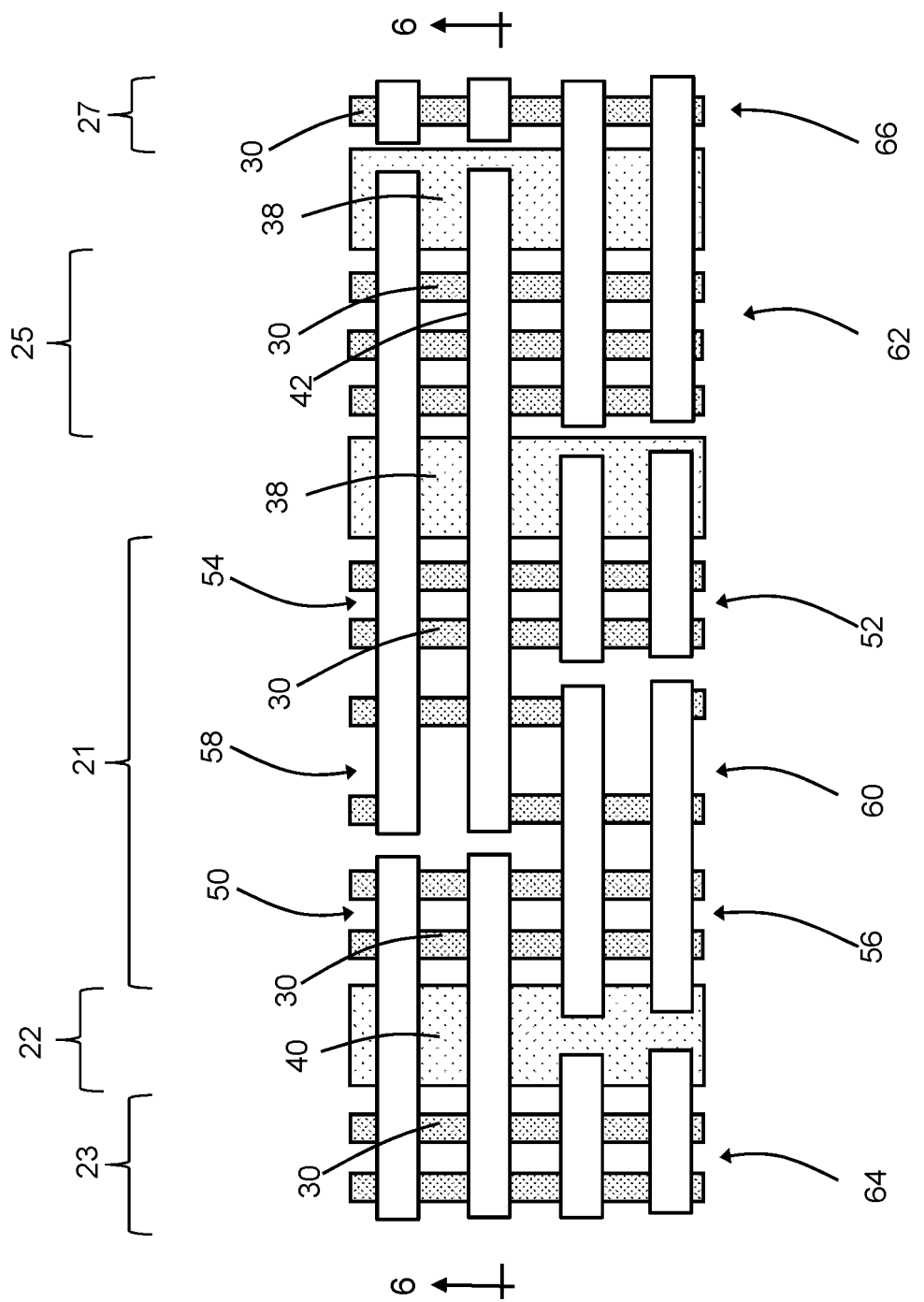
FIG. 7 is a diagrammatic top view of the structure of FIG. 6 illustrating the layout of the deep trench isolation regions and the semiconductor fins of a SRAM bit cell.

With reference to FIGS. 6, 7 in which like reference numerals refer to like features in FIG. 5 and at a subsequent fabrication stage, the dielectric layer 36 and the deep trench isolation regions 38, 40 are recessed with an etching process. An upper section of each semiconductor fin 30 is revealed by the recessing of the dielectric layer 36. A lower section of each semiconductor fin 30 remains surrounded by the recessed dielectric layer 36. Gate structures 42 are formed that extend along respective longitudinal axes transversely over the semiconductor fins 30 to define the transistors of the six-transistor portions 21, 23 and the read ports 25, 27 of the SRAM bit cells. Each gate structure 42 may include a gate electrode and a gate dielectric layer arranged between the overlapped sections of the semiconductor fins 30 and the gate electrode. The gate electrode may include one or more conformal barrier metal layers and/or work function metal layers, such as metal layers composed of titanium aluminum carbide and/or titanium nitride, and/or a metal gate fill layer composed of a conductor, such as tungsten. The gate dielectric layer may be composed of a high-k dielectric material, such as hafnium oxide. Source and drain regions (not shown) may be formed by epitaxial growth of semiconductor material from surfaces of the semiconductor fins 30.

As best shown in FIG. 7, the six-transistor portion 21 of the SRAM bit cell includes pass-gate transistors 50, 52 formed using the semiconductor fins 30, pull-down transistors 54, 56 formed using the semiconductor fins 30, and pull-up transistors 58, 60 formed using the semiconductor fins 30. The read port 25 of the SRAM bit cell also includes transistors 62 formed using the semiconductor fins 30. The six-transistor portion 23 of the adjacent SRAM bit cell includes pass-gate, pull-up, and pull transistors, generally indicated by reference numeral 64, formed using the semiconductor fins 30 and the read port 27 of the other adjacent SRAM bit cell includes transistors, generally indicated by reference numeral 66, formed using the semiconductor fins 30. The deep trench isolation region 40 is positioned at a location between the semiconductor fins 30 used to fabricate the pass-gate transistors 50, 52, the pull-down transistors 54, 56, and the pull-up transistors 58, 60 and the semiconductor fins 30 used to fabricate the pass-gate, pull-down, and pull-up transistors 64. One of the deep trench isolation regions 38 is positioned at a location between the semiconductor fins 30 used to fabricate the transistors 50, 52, 54, 56, 58, 60 and the semiconductor fins 30 used to fabricate the transistors 62 of the read port of the SRAM bit cell associated with the transistors 50, 52, 54, 56, 58, 60. Another of the deep trench isolation regions 38 is positioned at a location between the semiconductor fins 30 used to fabricate the read port 25 and the semiconductor fins 30 used to fabricate the transistors of the read port 27 of an adjacent SRAM bit cell.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a structure for a static random access memory, the method comprising:
    forming a first plurality of semiconductor fins of a first bit cell;
    forming a second plurality of semiconductor fins of a second bit cell;
    forming a third plurality of semiconductor fins laterally positioned between the first plurality of semiconductor fins and the second plurality of semiconductor fins; and
    forming a first deep trench isolation region that is laterally positioned between the first plurality of semiconductor fins of the first bit cell and the second plurality of semiconductor fins of the second bit cell,
    wherein the first deep trench isolation region is formed in a first trench, and the third plurality of semiconductor fins are removed when the first trench is patterned.

2. The method of claim 1 wherein the first plurality of semiconductor fins define a six-transistor portion of the first bit cell, and further comprising:
    forming a fourth plurality of semiconductor fins of the first bit cell; and
    forming a second deep trench isolation region positioned between the first plurality of semiconductor fins and the fourth plurality of semiconductor fins,
    wherein the fourth plurality of semiconductor fins define a read port of the first bit cell.

3. The method of claim 2 wherein the first deep trench isolation region and the second deep trench isolation region are concurrently formed.

4. The method of claim 1 wherein the first deep trench isolation region includes a portion that is arranged below a top surface of a substrate.

5. The method of claim 4 wherein the first plurality of semiconductor fins and the second plurality of semiconductor fins project away from the top surface of the substrate, and further comprising:
forming shallow trench isolation that surrounds the first plurality of semiconductor fins and the second plurality of semiconductor fins,
wherein the shallow trench isolation is comprised of a dielectric material, and the shallow trench isolation is positioned over the top surface of the substrate.

6. The method of claim 1 wherein the first plurality of semiconductor fins define a first six-transistor portion of the first bit cell, and the second plurality of semiconductor fins define a second six-transistor portion of the second bit cell.

7. The method of claim 1 wherein the first plurality of semiconductor fins have a first spacing, the second plurality of semiconductor fins have a second spacing, the first deep trench isolation region is laterally positioned in a break region between one of the first plurality of semiconductor fins and one of the second plurality of semiconductor fins, and the one of the first plurality of semiconductor fins and the one of the second plurality of semiconductor fins are separated by a distance that is greater than either the first spacing or the second spacing.

8. The method of claim 1 wherein the first plurality of semiconductor fins define a first six-transistor portion of the first bit cell, and the second plurality of semiconductor fins define a second six-transistor portion of the second bit cell.

9. The method of claim 8 wherein the first plurality of semiconductor fins define a six-transistor portion of the first bit cell, and further comprising:
forming a fourth plurality of semiconductor fins of the first bit cell,
wherein the fourth plurality of semiconductor fins define a read port of the first bit cell.

10. The method of claim 9 further comprising:
forming a second deep trench isolation positioned between the first plurality of semiconductor fins and the fourth plurality of semiconductor fins.

11. The method of claim 1 wherein the first plurality of semiconductor fins, the second plurality of semiconductor fins, and the third plurality of semiconductor fins are concurrently formed by an etching process.

12. The method of claim 1 wherein the first plurality of semiconductor fins, the second plurality of semiconductor fins, and the third plurality of semiconductor fins are concurrently formed by a self-aligned double patterning process.

13. The method of claim 1 wherein the first plurality of semiconductor fins and the second plurality of semiconductor fins project from a top surface of a semiconductor substrate, and further comprising:
forming a dielectric layer that surrounds the first plurality of semiconductor fins and the second plurality of semiconductor fins,
wherein the first deep trench isolation region includes a portion located in the semiconductor substrate below an interface between the dielectric layer and the top surface of the semiconductor substrate.

14. The method of claim 1 wherein forming the first deep trench isolation region that is laterally positioned between the first plurality of semiconductor fins of the first bit cell and the second plurality of semiconductor fins of the second bit cell comprises:
depositing a dielectric material in the first trench; and
planarizing the dielectric material to define the first deep trench isolation region.

15. The method of claim 14 wherein the dielectric material comprises silicon dioxide.

16. The method of claim 1 wherein the first plurality of semiconductor fins, the second plurality of semiconductor fins, and the third plurality of semiconductor fins are comprised of a single-crystal semiconductor material.

17. The method of claim 1 wherein the first plurality of semiconductor fins, the second plurality of semiconductor fins, and the third plurality of semiconductor fins are comprised of single-crystal silicon.

* * * * *